United States Patent
Lee et al.

(10) Patent No.: US 8,258,009 B2
(45) Date of Patent: Sep. 4, 2012

(54) CIRCUIT SUBSTRATE AND MANUFACTURING METHOD THEREOF AND PACKAGE STRUCTURE AND MANUFACTURING METHOD THEREOF

(75) Inventors: Chih-Cheng Lee, Taipei County (TW); Ho-Ming Tong, Taipei (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 44 days.

(21) Appl. No.: 12/898,728

(22) Filed: Oct. 6, 2010

(65) Prior Publication Data

US 2012/0032331 A1 Feb. 9, 2012

(30) Foreign Application Priority Data

Aug. 5, 2010 (TW) .................................... 99126132

(51) Int. Cl.
*H01L 21/44* (2006.01)
(52) U.S. Cl. ................. 438/110; 438/667; 257/E21.586
(58) Field of Classification Search .................. 438/110, 438/114, 673
See application file for complete search history.

(56) References Cited

U.S. PATENT DOCUMENTS

| | | | | |
|---|---|---|---|---|
| 7,179,738 | B2 * | 2/2007 | Abbott | 438/654 |
| 7,276,438 | B2 * | 10/2007 | Horikawa et al. | 438/618 |
| 7,557,014 | B2 * | 7/2009 | Okamoto et al. | 438/396 |

FOREIGN PATENT DOCUMENTS

| | | |
|---|---|---|
| CN | 101286454 | 10/2008 |
| CN | 101521189 A | 9/2009 |

OTHER PUBLICATIONS

"First Office Action of China Counterpart Application", issued on Jul. 20, 2011, p. 1-p. 10.
"2nd Office Action of China Counterpart Application", issued on Dec. 16, 2011, p. 1-p. 10.

* cited by examiner

*Primary Examiner* — Chandra Chaudhari
(74) *Attorney, Agent, or Firm* — Jianq Chyun IP Office

(57) ABSTRACT

A circuit substrate includes the following elements. A conductive layer and a dielectric layer are disposed on an inner circuit structure in sequence, and a plurality of conductive blind vias are embedded in the dielectric layer and connected to a portion of the conductive layer. A plating seed layer is disposed between each of the first blind vias and the first conductive layer. Another conductive layer is disposed on the dielectric layer, wherein a portion of the another conductive layer is electrically connected to the conductive layer through the conductive blind vias. A third plating seed layer is disposed between the third conductive layer and each of the first blind vias and on the first dielectric layer.

10 Claims, 12 Drawing Sheets

CIRCUIT SUBSTRATE AND MANUFACTURING METHOD THEREOF AND PACKAGE STRUCTURE AND MANUFACTURING METHOD THEREOF

CROSS-REFERENCE TO RELATED APPLICATION

This application claims the priority benefit of Taiwan application serial no. 99126132, filed on Aug. 5, 2010. The entirety of the above-mentioned patent application is hereby incorporated by reference herein and made a part of specification.

BACKGROUND OF THE INVENTION

1. Field of the Invention

The invention relates to a circuit board and a manufacturing method thereof and a semiconductor structure and a manufacturing method thereof. More particularly, the invention relates to a circuit substrate and a manufacturing method thereof and a package structure and a manufacturing method thereof.

2. Description of Related Art

Chip packaging is performed to protect bare chips, lower the density of chip contacts, and provide superior heat dissipation of chips. Conventional packaging methods include installing chips to a package carrier through wire bonding or flip chip bonding, so that the contacts on the chips can be electrically connected to the package carrier. Therefore, the contact distribution of the chips can be redistributed through the package carrier to satisfy the contact distribution of external devices of next hierarchy.

SUMMARY OF THE INVENTION

The invention is directed to a circuit substrate configured to carry a chip.

The invention is directed to a manufacturing method of a circuit substrate, and the manufacturing method is configured to manufacture the circuit substrate aforementioned.

The invention is directed to a package structure configured to package a chip.

The invention is directed to a manufacturing method of a package structure, where the manufacturing method is configured to manufacture the package structure aforementioned.

The invention is directed to a circuit substrate including an inner circuit structure, a first conductive layer, a second conductive layer, a first dielectric layer, a plurality of first conductive blind vias, a first plating seed layer, a second dielectric layer, a plurality of second conductive blind vias, a second plating seed layer, a third conductive layer, a third plating seed layer, and a fourth conductive layer. The inner circuit structure has an upper surface and a lower surface opposite to each other. The first conductive layer is disposed on the upper surface and exposes a portion of the upper surface. The second conductive layer is disposed on the lower surface and exposes a portion of the lower surface. The first dielectric layer is disposed on the upper surface of the inner circuit structure and covers the first conductive layer. The first conductive blind vias are embedded in the first dielectric layer and connected to a portion of the first conductive layer. The first plating seed layer is disposed between each of the first blind vias and the first conductive layer. The second dielectric layer is disposed on the lower surface of the inner circuit structure and covers the second conductive layer. The second conductive blind vias are embedded in the second dielectric layer and connected to a portion of the second conductive layer. The second plating seed layer is disposed between each of the second blind vias and the second conductive layer and on the second dielectric layer. The third conductive layer is disposed on the first dielectric layer. A portion of the third conductive layer is electrically connected to the first conductive layer through the first conductive blind vias. The third plating seed layer is disposed between the third conductive layer and each of the first conductive blind vias, and on the first dielectric layer. The fourth conductive layer is disposed on the second dielectric layer. A portion of the fourth conductive layer is electrically connected to the second conductive layer through the second conductive blind vias. Moreover, the fourth conductive layer and the second conductive blind vias are formed as an integrative unit.

The invention is further directed to a package structure including a circuit substrate and a chip. The circuit substrate includes an inner circuit structure, a first conductive layer, a second conductive layer, a first dielectric layer, a plurality of first conductive blind vias, a first plating seed layer, a second dielectric layer, a plurality of second conductive blind vias, a second plating seed layer, a third conductive layer, a third plating seed layer, and a fourth conductive layer. The inner circuit structure has an upper surface and a lower surface opposite to each other. The first conductive layer is disposed on the upper surface and exposes a portion of the upper surface. The second conductive layer is disposed on the lower surface and exposes a portion of the lower surface. The first dielectric layer is disposed on the upper surface of the inner circuit structure and covers the first conductive layer. The first conductive blind vias are embedded in the first dielectric layer and connected to a portion of the first conductive layer. The first plating seed layer is disposed between each of the first blind vias and the first conductive layer. The second dielectric layer is disposed on the lower surface of the inner circuit structure and covers the second conductive layer. The second conductive blind vias are embedded in the second dielectric layer and connected to a portion of the second conductive layer. The second plating seed layer is disposed between each of the second blind vias and the second conductive layer and on the second dielectric layer. The third conductive layer is disposed on the first dielectric layer. A portion of the third conductive layer is electrically connected to the first conductive layer through the first conductive blind vias. The third plating seed layer is disposed between the third conductive layer and each of the first conductive blind vias, and on the first dielectric layer. The fourth conductive layer is disposed on the second dielectric layer. A portion of the fourth conductive layer is electrically connected to the second conductive layer through the second conductive blind vias. Moreover, the fourth conductive layer and the second conductive blind vias are formed as an integrative unit. The chip is disposed on the circuit substrate and electrically connected to the same.

The invention is directed to a manufacturing method of a circuit substrate, and the manufacturing method includes the following. An inner circuit structure is provided. The inner circuit structure has an upper surface and a lower surface opposite to each other, a first conductive layer disposed on the upper surface and exposing a portion of the upper surface, and a second conductive layer disposed on the lower surface and exposing a portion of the lower surface. The inner circuit structure has a first dielectric layer disposed on the upper surface and covering the first conductive layer, a second dielectric layer disposed on the lower surface and covering the second conductive layer, a plurality of first conductive blind vias embedded in the first dielectric layer and connected to a portion of the first conductive layer, a plurality of second conductive blind vias embedded in the second dielectric layer and connected to a portion of the second conductive layer, a fourth conductive layer disposed on the second dielectric, layer, a first plating seed layer disposed between each of the first blind vias and the first conductive layer, and a second plating seed layer disposed between each of the second conductive blind vias and the second conductive layer and on the second dielectric layer. A portion of the fourth conductive layer is electrically connected to the second conductive layer through the second conductive blind vias. The fourth conductive layer and the second conductive blind vias are formed as an integrative unit The inner circuit structure is fixed on a wafer carrier, so that the second dielectric layer contacts the wafer carrier. A third plating seed layer and a third conductive layer are formed on the first dielectric layer. Herein, a portion of the third conductive layer is electrically connected to the first conductive layer through the first conductive blind vias, and a portion of the third plating seed layer is disposed between the third conductive layer and each of the first conductive blind vias. The wafer carrier is removed to expose a portion of the fourth conductive layer and a portion of the second dielectric layer.

In light of the foregoing, since the circuit substrate of the invention adopts a semiconductor wafer apparatus to manufacture a conductive circuit thereon, the conductive circuit formed on the circuit substrate has a higher manufacture yield rate. Consequently, the conductive layer has shorter line width and line distance to result in a more compact conductive circuit.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
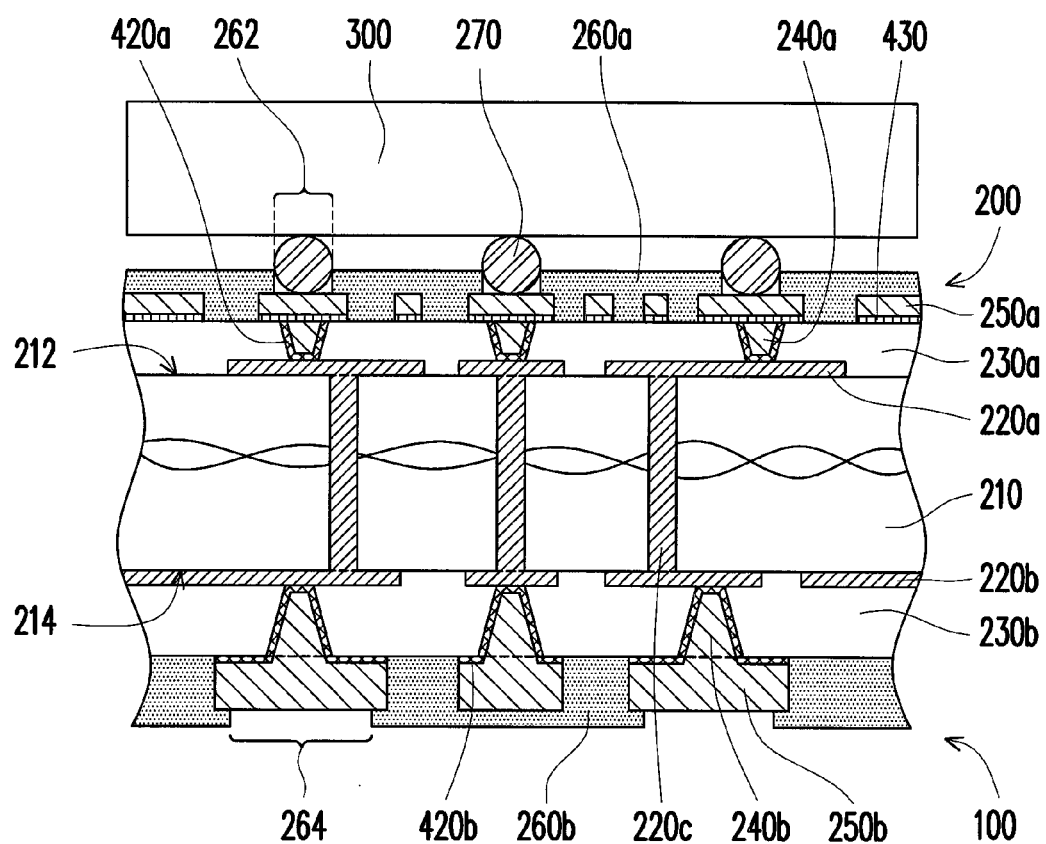
FIG. 1 is a schematic cross-sectional view of a package structure according to an embodiment of the invention.

FIG. 1 is a schematic cross-sectional view of a package structure according to an embodiment of the invention. Referring to FIG. 1, in the present embodiment, a package structure 100 includes a circuit substrate 200 and a chip 300. The chip 300 is disposed on the circuit substrate 200 and electrically connected to the same.

The circuit substrate 200 includes an inner circuit structure 210, a first conductive layer 220a, a second conductive layer 220b, a first dielectric layer 230a, a plurality of first conductive blind vias 240a, a first plating seed layer 420a, a second dielectric layer 230b, a plurality of second conductive blind vias 240b, a second plating seed layer 420b, a third conductive layer 250a, a third plating seed layer 430, and a fourth conductive layer 250b.

The inner circuit structure 210 has an upper surface 212 and a lower surface 214 opposite to each other. In the present embodiment, the inner circuit structure 210 is, for example, a glass fiber dielectric layer having a plurality of conductive through via holes 220c; however, the invention is not limited thereto. In other embodiments not illustrated herein, the inner circuit structure 210 can also be a stacked structure constituted by a plurality of dielectric layers and a plurality of conductive layers. Moreover, the conductive layers can be electrically connected through a plurality of conductive connecting structures. The first conductive layer 220a is disposed on the upper surface 212 of the inner circuit structure 210 and exposes a portion of the upper surface 212. The second conductive layer 220b is disposed on the lower surface 214 of the inner circuit structure 210 and exposes a portion of the lower surface 214.

The first dielectric layer 230a is disposed on the upper surface 212 of the inner circuit structure 210 and covers the first conductive layer 220a. The first conductive blind vias 240a are embedded in the first dielectric layer 230a and connected to a portion of the first conductive layer 220a. Specifically, the first plating seed layer 420a is disposed between each of the first conductive blind vias 240a and the first conductive layer 220a. The second dielectric layer 230b is disposed on the lower surface 214 of the inner circuit structure 210 and covers the second conductive layer 220b. The second conductive blind vias 240b are embedded in the second dielectric layer 230b and connected to a portion of the second conductive layer 220b. In particular, the second plating seed layer 420b is disposed between each of the second conductive blind vias 240b and the second conductive layer 220b and on a portion of the second dielectric layer 230b. It should be noted that in the present embodiment, a thickness of the first dielectric layer 230a is less or equal to a thickness of the second dielectric layer 230b, for instance.

The third conductive layer 250a is disposed on the first dielectric layer 230a. A portion of the third conductive layer 250a is electrically connected to the first conductive layer 220a through the first conductive blind vias 240a. The third plating seed layer 430 is disposed between the third conductive layer 250a and each of the first conductive blind vias 240a and on a portion of the first dielectric layer 230a. The fourth conductive layer 250b is disposed on the second dielectric layer 230b. A portion of the fourth conductive layer 250b is electrically connected to the second conductive layer 220b through the second conductive blind vias 240b. Moreover, the fourth conductive layer 250b and the second conductive blind vias 240b are formed as an integrative unit. It should be illustrated that in the present embodiment, a shape of a cross-section of the third conductive layer 250a gradually increases from the first dielectric layer 230a in a direction away from the inner circuit structure 210, for example, and a thickness of the third conductive layer 250a is, for instance, less or equal to a thickness of the fourth conductive layer 250b.

In addition, the circuit substrate 200 of the present embodiment further includes a first solder mask 260a and a second solder mask 260b. The first solder mask 260a covers a portion of the third conductive layer 250a and a portion of the first dielectric layer 230a exposed by the third conductive layer 250a. Here, a portion of the third conductive layer 250a not covered by the first solder mask 260a constitutes a plurality of first pads 262. The second solder mask 260b covers a portion of the fourth conductive layer 250b and a portion of the second dielectric layer 230b exposed by the fourth conductive layer 250b. A portion of the fourth conductive layer 250b not covered by the second solder mask 260b constitutes a plurality of second pads 264. The second pads 264 are electrically connected to an external circuit (not shown) through a plurality of solder balls (not shown) or protrusions (not shown). Moreover, the chip 300 of the present embodiment is structurally and electrically connected to the first pads 262 through a plurality of conductive protrusions pre-disposed thereon.

The first conductive layer 220a, the first conductive blind vias 240a, the third conductive layer 250a, the second conductive layer 220b, the second conductive blind vias 240b, and the fourth conductive layer 250b of the present embodiment are formed through different fabrication steps and using semiconductor fabrication apparatuses of different levels. Consequently, the first conductive blind vias 240a have the first plating seed layer 420a and the third plating seed layer 430 between the first conductive layer 220a and the third conductive layer 250a respectively. However, the second conductive blind vias 240b merely have the second plating seed layer 420b between the second conductive layer 220b and the fourth conductive layer 250b. By adopting semiconductor fabrication apparatuses of different levels, a thickness of the third conductive layer 250a of the circuit substrate 200 in the present embodiment is less or equal to a thickness of the fourth conductive layer 250b.

It should be noted that in the present embodiment, the first plating seed layer 420a, the second plating seed layer 420b, and the third plating seed layer 430 are each, for example, a copper layer or a titanium copper composite layer. When the first plating seed layer 420a, the second plating seed layer 420b, or the third plating seed layer 430 is a copper layer, a thickness of the copper layer ranges from 0.1 micrometer (μm) to 1 μm. When the first plating seed layer 420a, the second plating seed layer 420b, or the third plating seed layer 430 is a titanium copper composite layer, the titanium copper composite layer is constituted by a titanium layer and a copper layer, and a thickness of the titanium layer ranges from 1000 Å to 5000 Å and a thickness of the copper layer ranges from 1000 Å to 10000 Å.

The above merely illustrates the package structure 100 of some of the embodiments in the invention, but does not introduce the manufacturing method of the package structure of the invention. Accordingly, a manufacturing method of a package structure is illustrated in the following with an embodiment. Moreover, FIGS. 2A to 2L are shown to describe the manufacturing method of the package structure in detail.

Figure 2A:
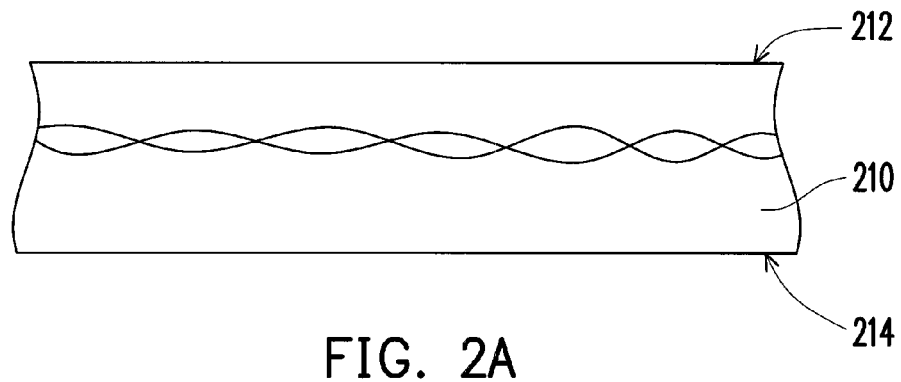
FIGS. 2A to 2L are schematic cross-sectional views of a manufacturing method of a package structure according to an embodiment of the invention.

FIGS. 2A to 2L are schematic cross-sectional views of a manufacturing method of a package structure according to an embodiment of the invention. Referring to FIG. 2A, in a manufacturing method of a package structure in the present embodiment, an inner circuit structure 210 is provided. The inner circuit structure 210 has an upper surface 212 and a lower surface 214 opposite to each other. In the present embodiment, the inner circuit structure 210 is, for instance, a glass fiber dielectric layer. However, in other embodiments not illustrated herein, the inner circuit structure 210 can also be a stacked structure constituted by a plurality of dielectric layers and a plurality of conductive layers. Moreover, the conductive layers can be electrically connected through a plurality of conductive connecting structures, and the invention is not limited thereto.

Figure 2B:
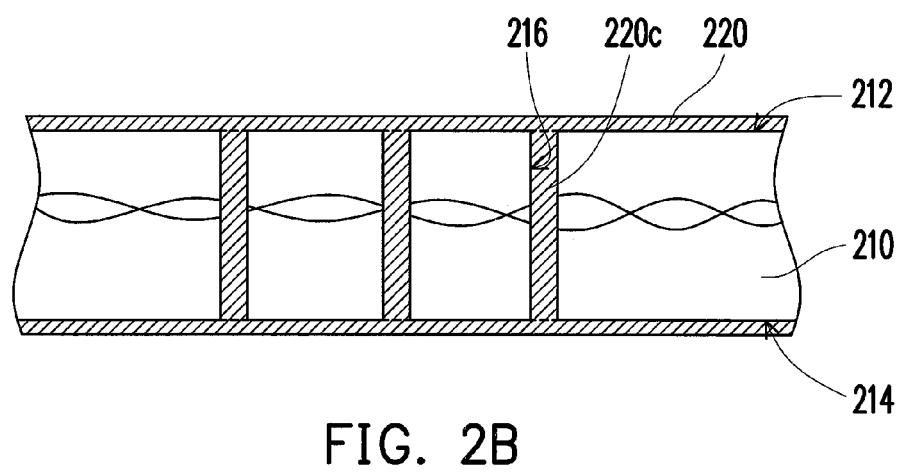

Referring to FIG. 2B, a mechanical drilling process is performed to the inner circuit structure 210 to form at least one through hole 216 connecting the first surface 212 and the second surface 214. An electroplating process is performed to the inner circuit structure 210 to form a conductive layer 220 on the first surface 212 and the second surface 214 of the inner circuit structure 210 and in the through holes 216. Here, the conductive layer 220 fills the through holes 216 to constitute a plurality of conductive through via hole structures 220c.

Figure 2C:
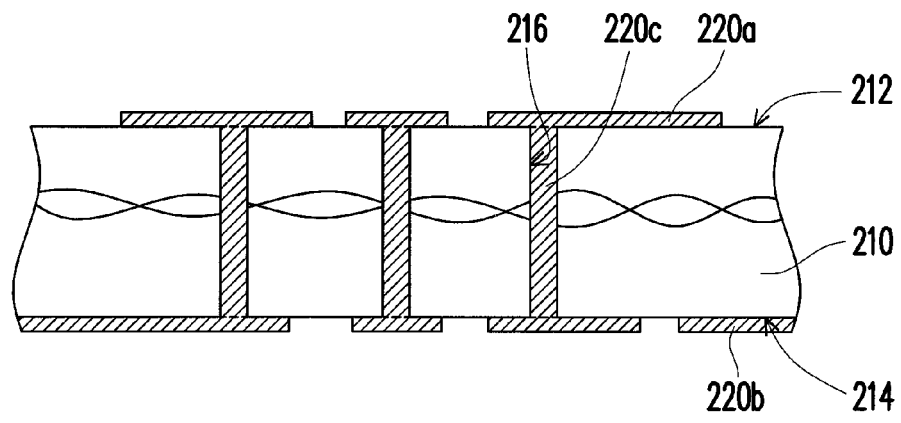

Referring to FIG. 2C, a patterning process is performed to the conductive layer 220 to form a first conductive layer 220a disposed on the upper surface 212 of the inner circuit structure 210 and exposing a portion of the upper surface 212, and a second conductive layer 220b disposed on the lower surface 214 of the inner circuit structure 210 and exposing a portion of the lower surface 214. In the present embodiment, the first conductive layer 220a is electrically connected to the second conductive layer 220b through the conductive through via hole structures 220c.

Figure 2D:
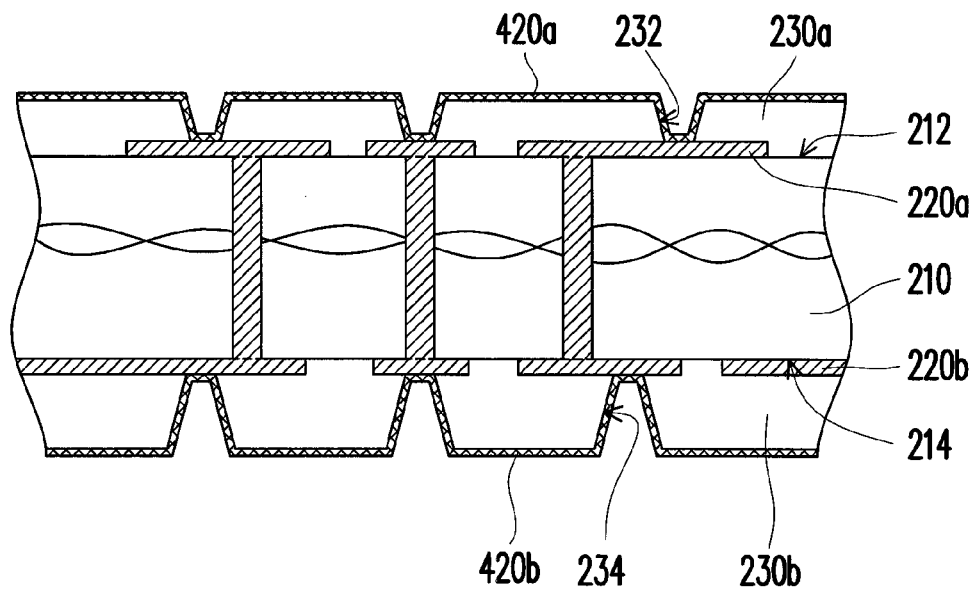

Referring to FIG. 2D, a first dielectric layer 230a having a plurality of first openings 232 and a second dielectric layer 230b having a plurality of second openings 235 are formed. The first dielectric layer 230a is disposed on the upper surface 212 of the inner circuit structure 210 and covers the first conductive layer 220a. The first openings 232 exposes a portion of the first conductive layer 220a. The second dielectric layer 230b is disposed on the lower surface 214 of the inner circuit structure 210 and covers the second conductive layer 220b. The second openings 234 exposes a portion of the second conductive layer 220b. In the present embodiment, a thickness of the first dielectric layer 230a is less or equal to a thickness of the second dielectric layer 230b, for instance.

Referring to FIG. 2D, a first plating seed layer 420a is formed between the first conductive layer 220a and the first openings 232 and on the first dielectric layer 230a, and a second plating seed layer 420b is formed between the second conductive layer 220b and the second openings 234 and on the second dielectric layer 230b. Here, the first plating seed layer 420a and the second plating seed layer 320b can be a copper layer with a thickness ranging from 0.1 μm to 1 μm, for instance, or, a titanium copper composite layer including a titanium layer and a copper layer. Here, a thickness of the titanium layer ranges from 1000 Å to 5000 Å and a thickness of the copper layer ranges from 1000 Å to 10000 Å.

Figure 2E:
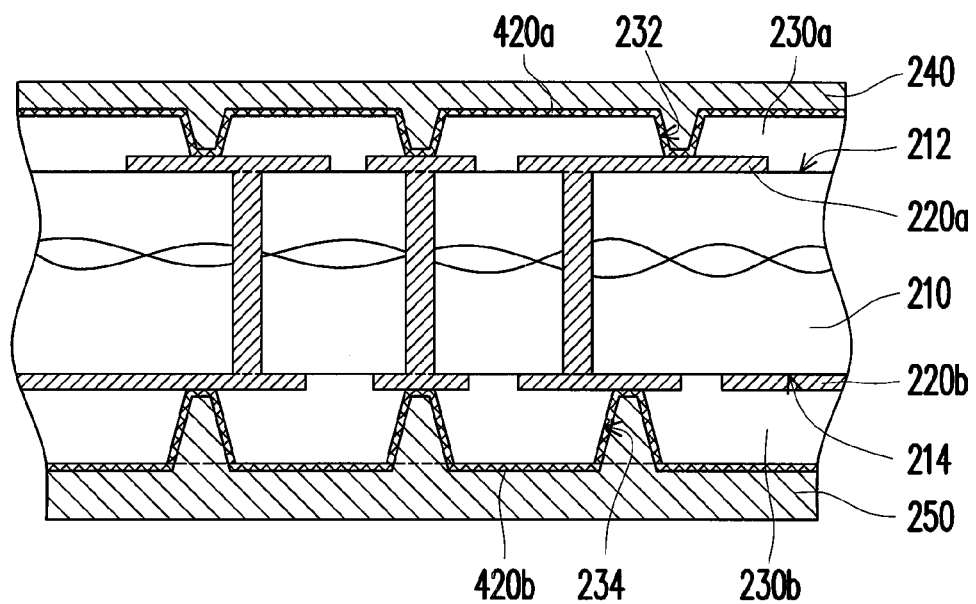

Referring to FIG. 2E, an electroplating process is performed so as to electroplate a first metal layer 240 on the first dielectric layer 230a and in the first openings 232 and electroplate a second metal layer 250 on the second dielectric layer 230b and in the second openings 234 through the first plating seed layer 420a and the second plating seed layer 420b. In the present embodiment, the first metal layer 240 fills the first openings 232 and electrically connects a portion of the first conductive layer 220a exposed by the first openings 232. Here, the first plating seed layer 420a is located between the first metal layer 240 and the first conductive layer 220a and between the first metal layer 240 and the first dielectric layer 230a. The second metal layer 250 fills the second openings 234 and electrically connects a portion of the second conductive layer 220b exposed by the second openings 234. The second plating seed layer 420b is located between the second metal layer 250 and the second conductive layer 220b and between the second metal layer 250 and the second dielectric layer 230b.

Figure 2F:
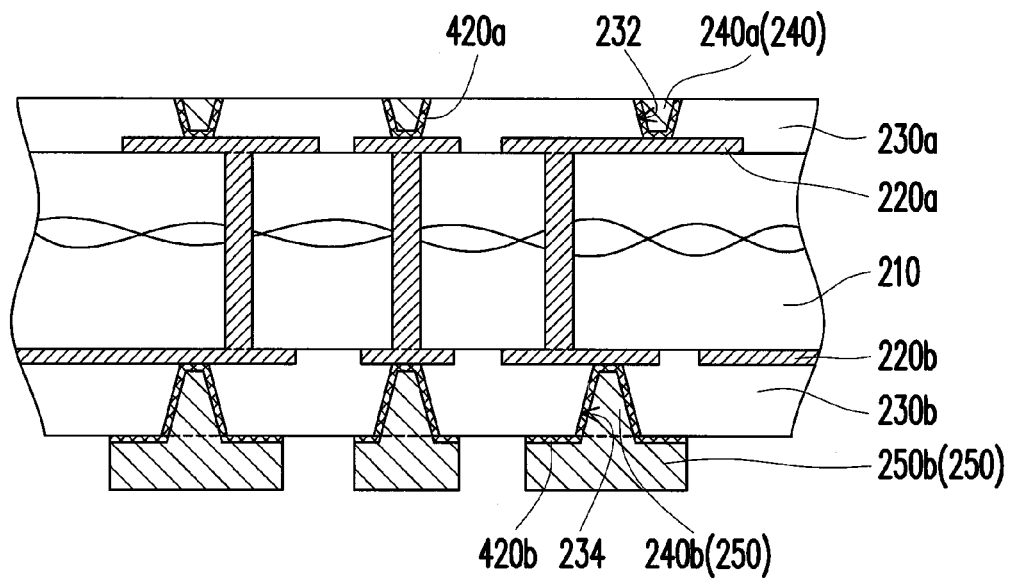

Referring to FIG. 2F, a patterning process is performed to the second metal layer 250 to form a fourth conductive layer 250b on the second dielectric layer 230b. The fourth conductive layer 250b exposes a portion of the second dielectric layer 230b. In other words, a portion of the second metal layer 250 disposed in the second openings and filling the second openings 234 is deemed as a plurality of second conductive blind vias 240b embedded in the second dielectric layer 230b. Here, the second conductive blind vias 240b is connected to a portion of the second conductive layer 220b, and a portion of the second plating seed layer 420b is located between each of the second conductive blind vias 240b and the second conductive layer 230b.

Formed with the same electroplating process, the fourth conductive layer 250b and the second conductive blind vias 240b of the present embodiment are deemed as an integrative unit. In addition, a portion of the fourth conductive layer 250b is electrically connected to the second conductive layer 220b through the second conductive blind vias 240b.

Referring to FIG. 2F, a portion of the first metal layer 240 located above the first dielectric layer 230a and the first plating seed layer 420a located below the same are removed, so that a surface of the first metal layer located in the first openings and a surface of the first dielectric layer 230a are substantially aligned to form a plurality of first conductive blind vias 240a. In other words, the first conductive blind vias 240a are embedded in the first dielectric layer 230a and connect with a portion of the first conductive layer 220a. Additionally, the first plating seed layer 420a is located between each of the first conductive blind vias 240a and the first conductive layer 230a.

Figure 2G:
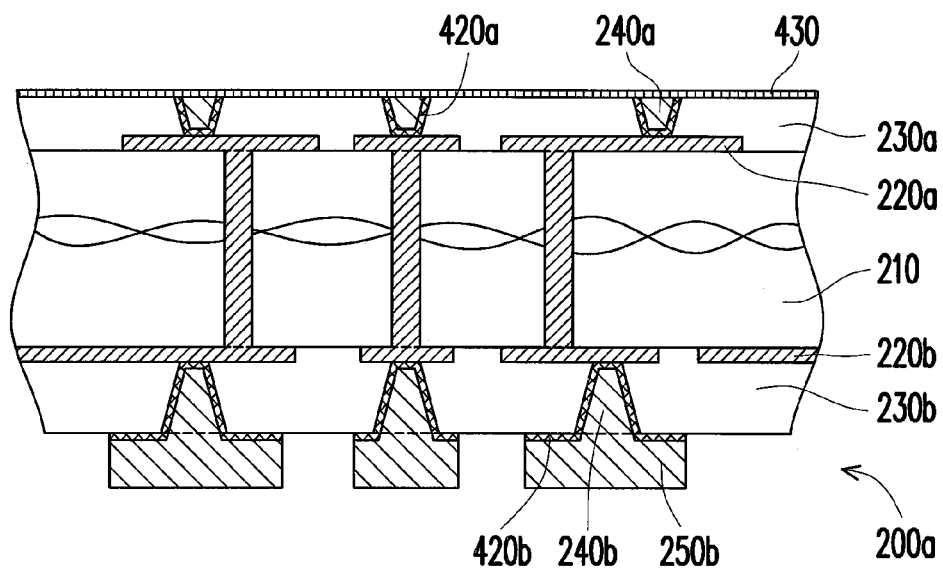

Referring to FIG. 2G, a third plating seed layer 430 is formed on the first dielectric layer 230a and the first conductive blind vias 240a. Here, the third plating seed layer 430 covers the first dielectric layer 230a and the first conductive blind vias 240a, and the first plating seed layer 420a is located between the third plating seed layer 430 and the first conductive blind vias 240a. In the present embodiment, the third plating seed layer 430 is formed by an electroless plating process to form a copper layer with a thickness ranging from 0.1 μm to 1 μm, or by a sputtering process to form a titanium copper composite layer including a titanium layer and a copper layer. Here, a thickness of the titanium layer ranges from 1000 Å to 5000 Å and a thickness of the copper layer ranges from 1000 Å to 10000 Å.

It should be illustrated that the structure formed up to this point (including the inner circuit structure 210, the first conductive layer 220a, the second conductive layer 220b, the first dielectric layer 230a, the first conductive blind vias 240a, the first plating seed layer 420a, the second dielectric layer 230b, the second conductive blind vias 240b, the second plating seed layer 420b, the fourth conductive layer 250b, and the third plating seed layer 430) is deemed as a semi-finished circuit substrate 200a.

Figure 2H:
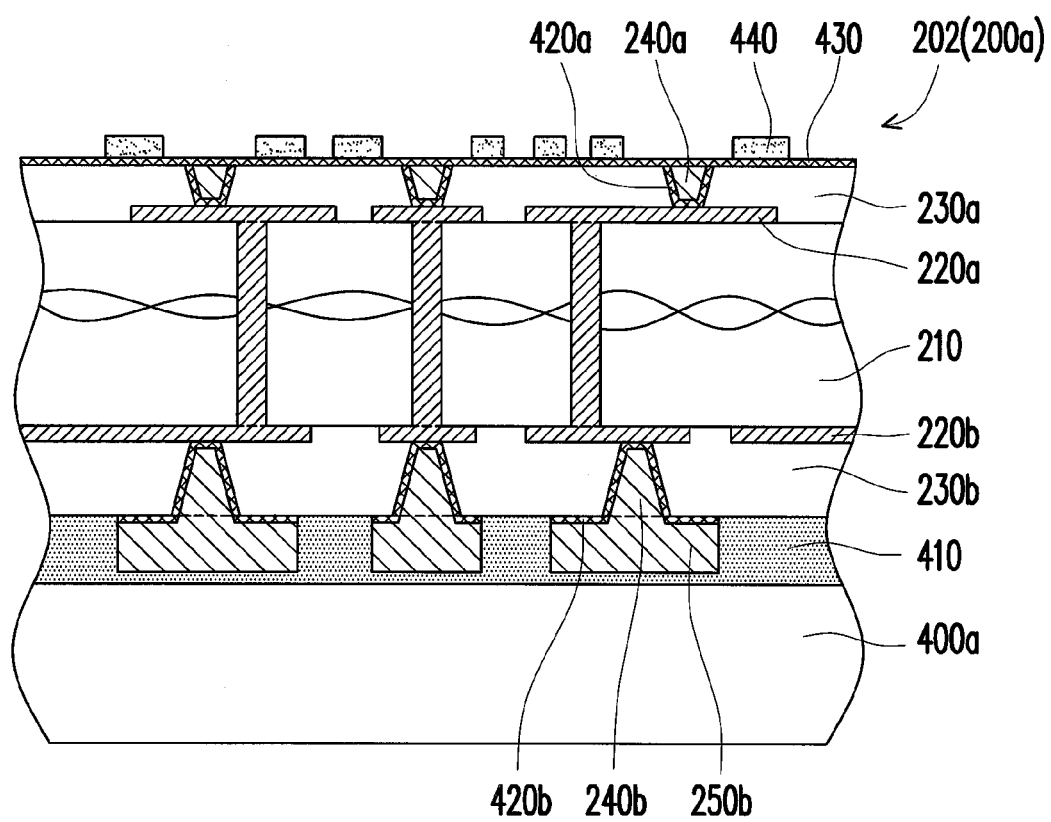

Referring to FIG. 2H, the semi-finished circuit substrate 200a is fixed on a wafer carrier 400a through a release film 410. Herein, the second dielectric layer 230a faces the wafer carrier 400a. Thereafter, a patterned photoresist layer 440 is formed on the third plating seed layer 430. The patterned photoresist layer 440 adopts, for example, positive photoresist, and the patterned photoresist layer 440 exposes a portion of the third plating seed layer 430. It should be noted that as the semi-finished circuit substrate 200a is disposed on the wafer carrier 400a, the semi-finished circuit substrate 200a can adopt a semiconductor wafer apparatus to manufacture a conductive circuit thereon in the subsequent manufacturing process.

Figure 2I:
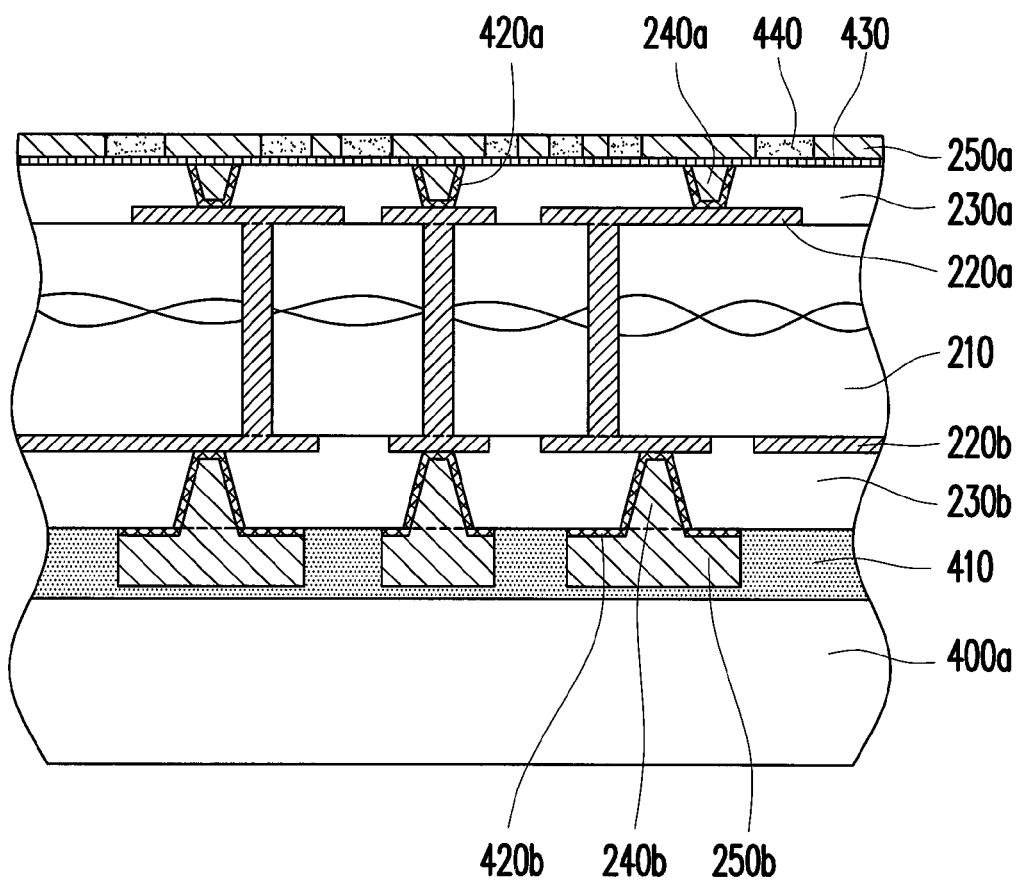

Referring to FIG. 2I, the patterned photoresist layer 440 is used as an electroplating mask to perform an electroplating process for electroplating a third conductive layer 250a on a portion of the third plating seed layer 430 exposed by the patterned photoresist layer 440. Here, the third conductive layer 250a does not cover the patterned photoresist layer 440.

Figure 2J:
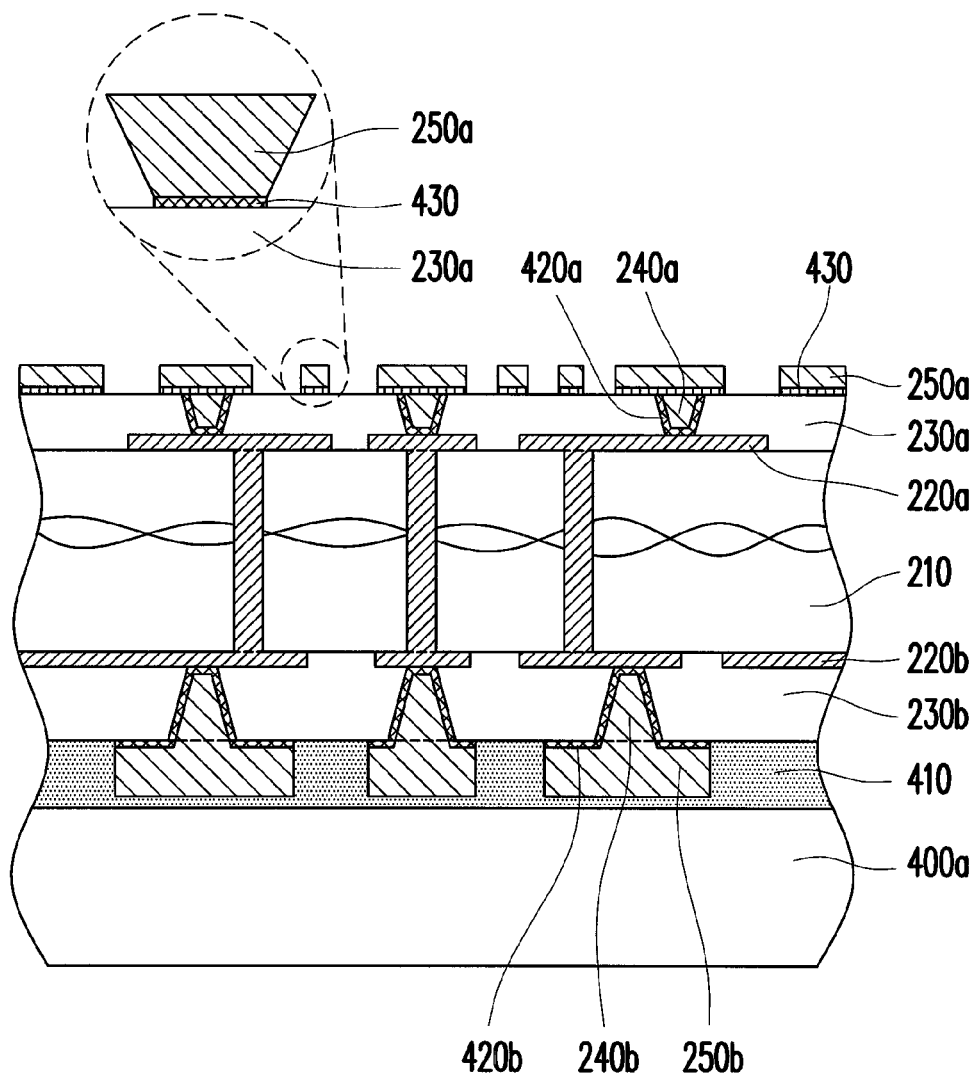

Referring to FIG. 2J, the patterned photoresist layer 440 and the third plating seed layer 430 below are removed to form the third conductive layer 250a. The third conductive layer 250a exposes a portion of the first dielectric layer 230a. In the present embodiment, the third conductive layer 250a is disposed on the first dielectric layer 230a. A portion of the third conductive layer 250a is electrically connected to the first conductive layer 220a through the first conductive blind vias 240a and the third plating seed layer 430 therebelow. In addition, the third plating seed layer 430 is located between the third conductive layer 250a and each of the first conductive blind vias 240a. In the present embodiment, the patterned photoresist layer 440 is removed by, for example, a stripping method, and the third plating seed layer 430 is removed by, for example, a flash etching method.

It should be mentioned that since the third conductive layer 250a can apply a semiconductor wafer apparatus for the manufacture, a thickness of the third conductive layer 250a can be less or equal to a thickness of the fourth conductive layer 250b. Moreover, the third conductive layer 250a has shorter line width and line distance. For instance, the line width is shorter than 15 μm and the line distance is shorter than 15 μm. More preferably, the line width and the line distance of the third conductive layer 250a are both 10 μm so as to produce a more compact conductive circuit. As the third conductive layer 250a adopts positive photoresist as the electroplating mask, a cross-section of the third conductive layer 250a has a shape that gradually increases from the first dielectric layer 230a in a direction away from the inner circuit structure 210, for example.

Figure 2K:
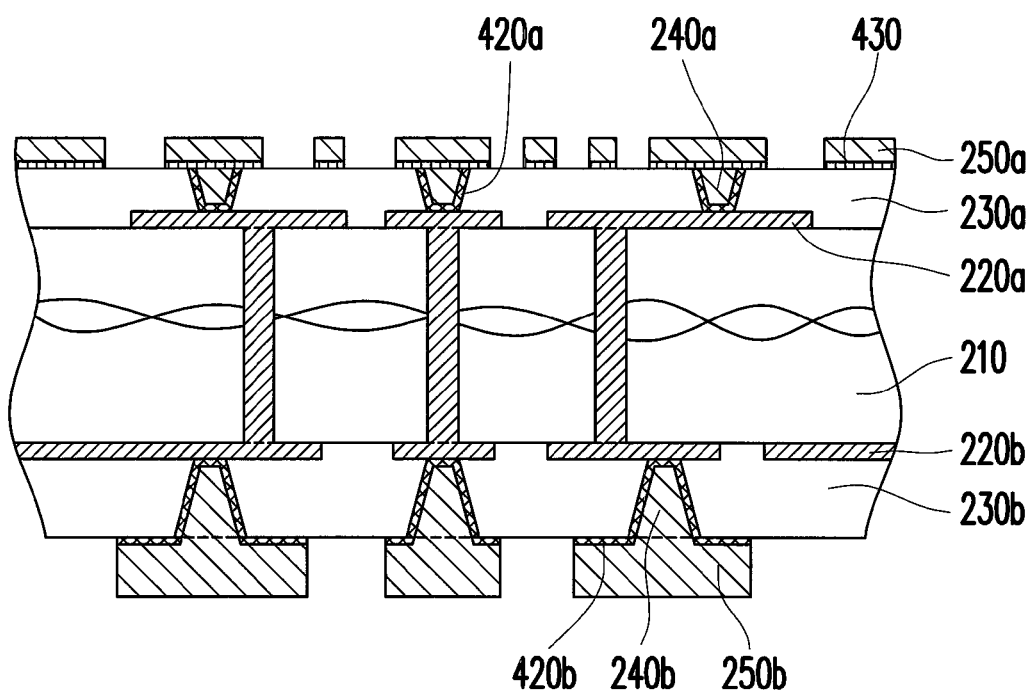

Referring to FIG. 2K, the wafer carrier 400a and the release film 410 are removed to expose a portion of the fourth conductive layer 250b and a portion of the second dielectric layer 230b. In the present embodiment, the wafer carrier 400a and the release film 410 are removed by a lift off method, for instance.

Figure 2L:
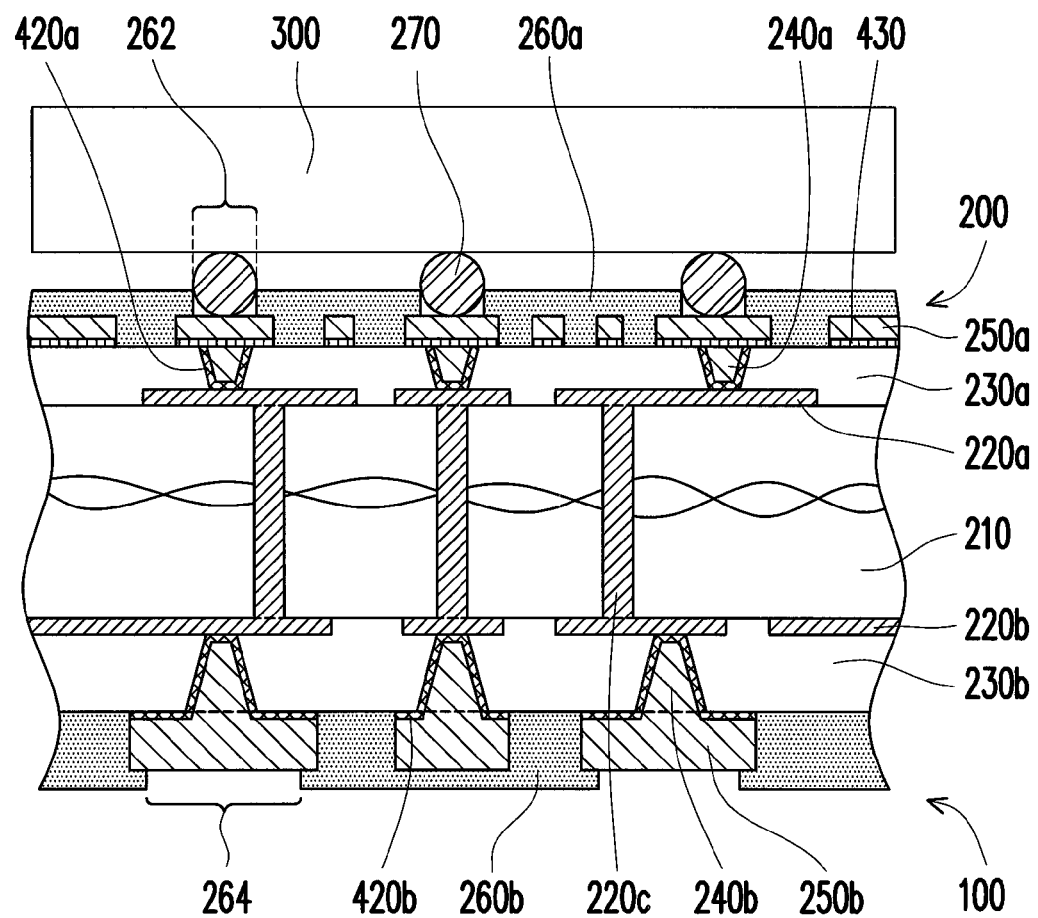

Referring to FIG. 2L, a first solder mask 260a is formed to cover a portion of the third conductive layer 250a and a portion of the first dielectric layer 230a exposed by the third conductive layer 250a. Here, a portion of the third conductive layer 250a not covered by the first solder mask 260a constitutes a plurality of first pads 262. A second solder mask 260b is formed to cover a portion of the fourth conductive layer 250b and a portion of the second dielectric layer 230b exposed by the fourth conductive layer 250b. Here, a portion of the fourth conductive layer 250b not covered by the second solder mask 260b constitutes a plurality of second pads 264. Up to this point, the manufacture of a circuit substrate 200' is completed.

Referring to FIG. 2L, a plurality of protrusions 270 is formed on the first pads 262. A chip 300 is installed on the first solder mask 260a. Here, the chip 300 is electrically connected to the first pads 262 through the protrusions 270. Further, the second pads 264 are electrically connected to an external circuit (not shown) through a plurality of solder balls (not shown) or protrusions (not shown). Accordingly, in the present embodiment, the first pads 262 and the second pads 264 are used to connect the chip 300 or the external circuit (not shown) to widen the application of the circuit substrate 200'. Here, the manufacture of a package structure 100a is completed.

Figure 3A:
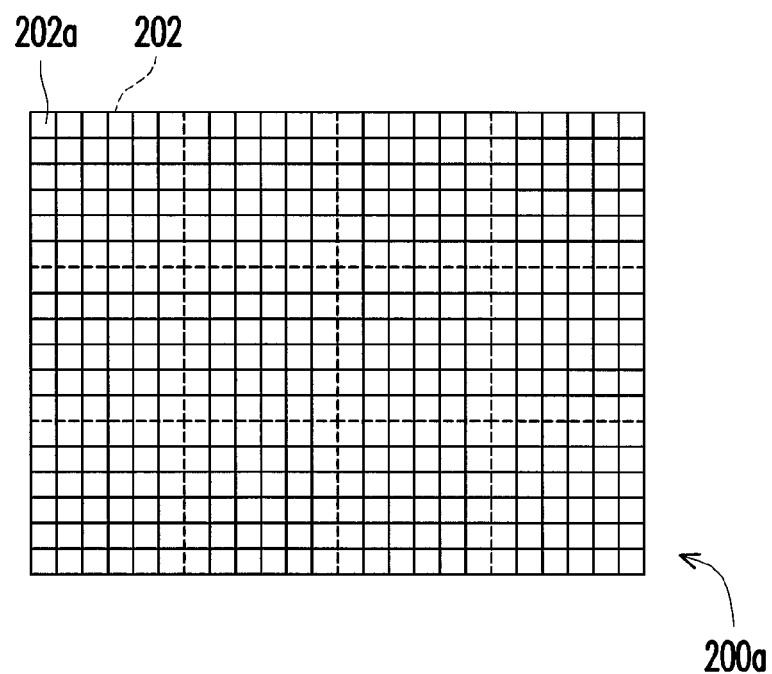
FIGS. 3A to 3B are schematic diagrams of a circuit board unit and a disposition of the circuit board unit and a wafer carrier according to an embodiment of the invention.
Figure 3B:
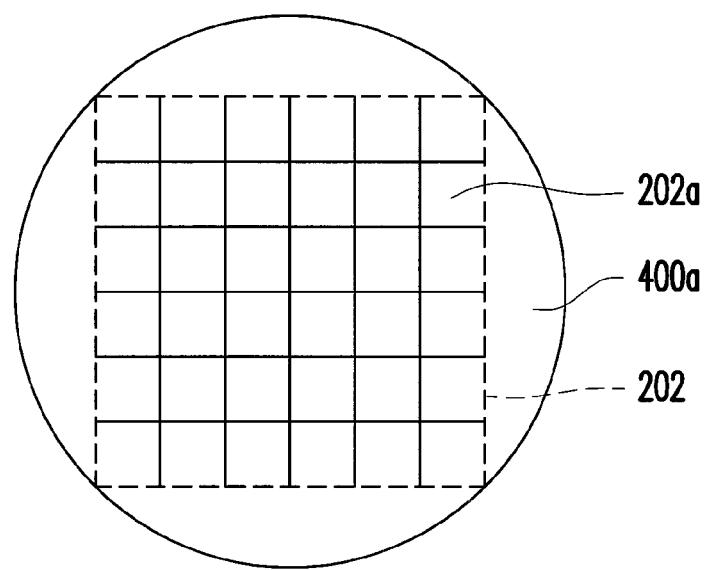

It should be illustrated that before the wafer carrier 400a is fixed on the second dielectric layer 230b of the semi-finished circuit substrate 200a, referring to FIG. 3A, a cutting process is performed to the semi-finished circuit substrate 200a to form a plurality of circuit board units 202 in rectangles. Each of the circuit board units 202 has a plurality of circuit board sub-units 202a in rectangles. Referring to FIGS. 2H and 3B, the wafer carrier 400a is fixed on the second dielectric layer 230b of each of the circuit board units 202. Here, the wafer carrier 400a is fixed to the second dielectric layer 230b of each of the circuit board units 202 through the release film 410.

Figure 4A:
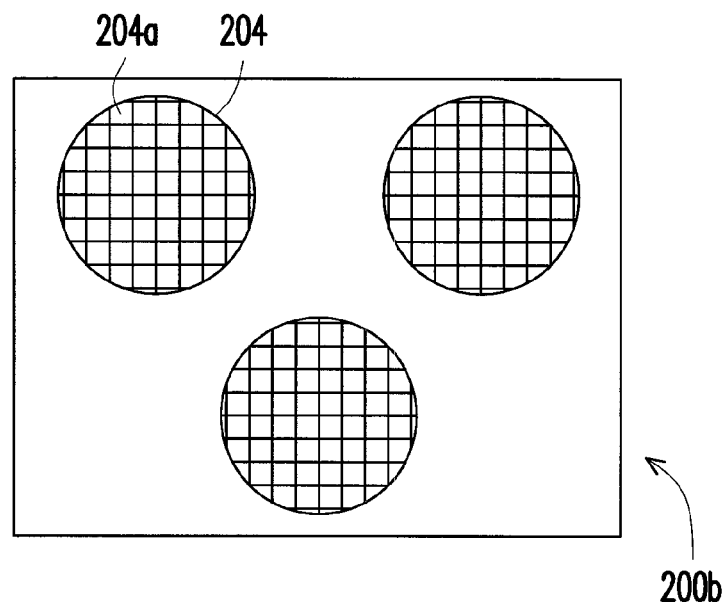
FIGS. 4A to 4B are schematic diagrams of a circuit board unit and a disposition of the circuit board unit and a wafer carrier according to an embodiment of the invention.
Figure 4B:
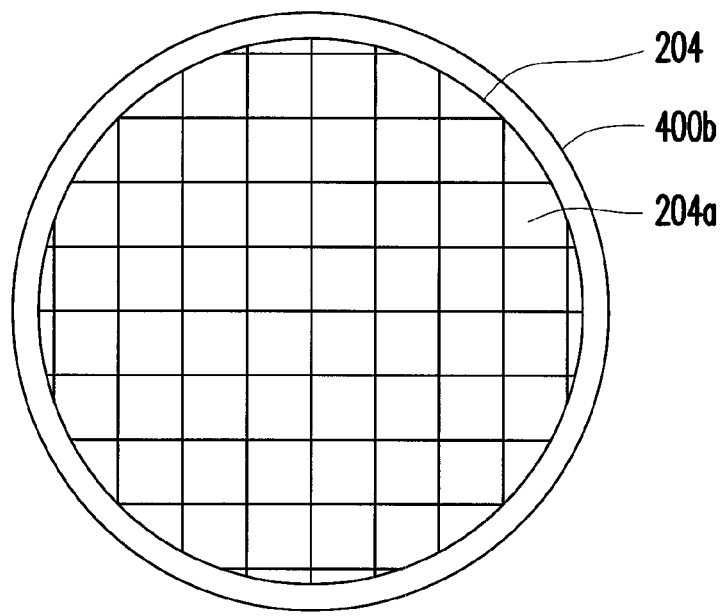
Figure 5A:
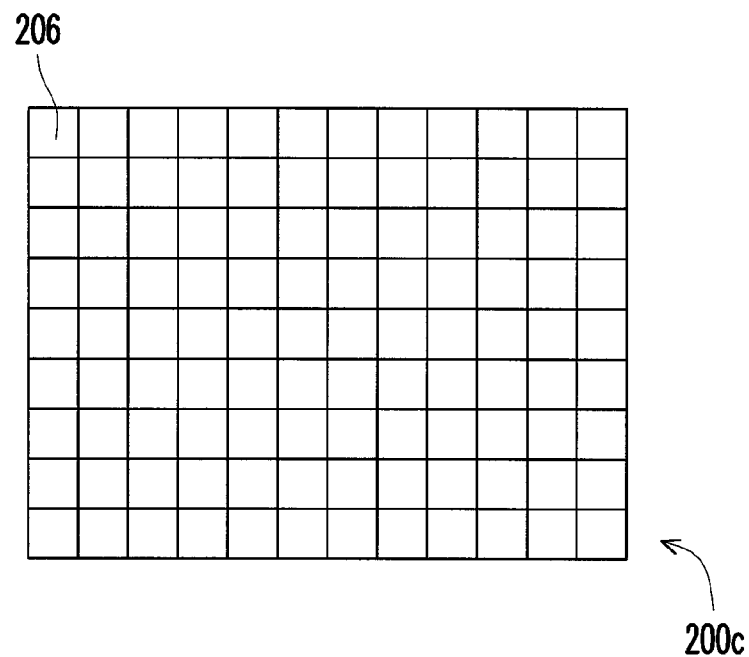
FIGS. 5A to 5B are schematic diagrams of a circuit board unit and a disposition of the circuit board unit and a wafer carrier according to an embodiment of the invention.
Figure 5B:
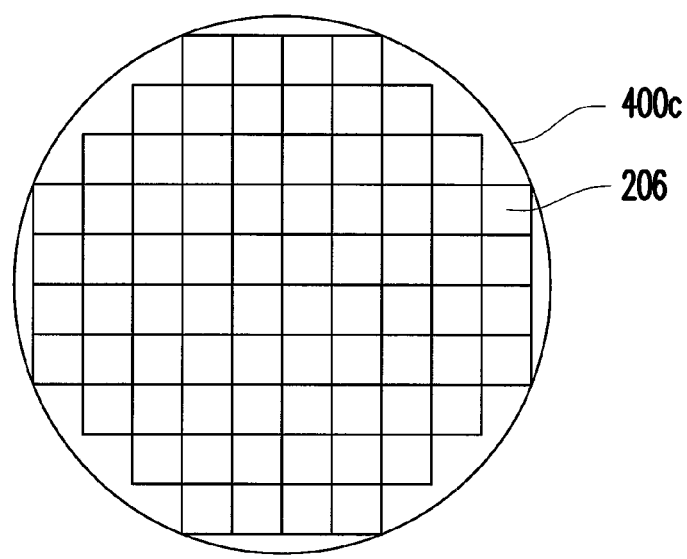

It should be noted that the shape of the circuit board units 202 is not limited in the invention. In practice, the circuit board units 202 described herein are in rectangles and each of the circuit board units 202 has the circuit board sub-units 202a in rectangles. Nevertheless, in other embodiments, referring to FIGS. 4A and 4B, a semi-finished circuit substrate 200b can also form a plurality of circuit board units 204 in circles by a cutting process. Here, each of the circuit board units 204 has a plurality of circuit board sub-units 204a in rectangles, and a wafer carrier 400b is fixed on the second dielectric layer 230b of each of the circuit board units 204. In other words, each of the circuit board units 204 and the wafer carrier 400b have the same shape. Obviously, referring to FIGS. 5A and 5B simultaneously, a semi-finished circuit substrate 200c can also form a plurality of circuit board units 206 in small rectangles by a cutting process, and the wafer carrier 400b is fixed to the second dielectric layer 230b of each of the circuit board units 206. The embodiments aforementioned can all be adopted by the invention and does not depart from the scope protected by the invention.

In summary, since the circuit substrate of the invention adopts a semiconductor wafer apparatus to manufacture a conductive circuit thereon, the conductive circuit formed on the circuit substrate has a higher manufacture yield rate. Consequently, the conductive layer has shorter line width and line distance to result in a more compact conductive circuit.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a circuit substrate, the manufacturing method comprising:
    providing an inner circuit structure having an upper surface and a lower surface opposite to each other, a first conductive layer disposed on the upper surface and exposing a portion of the upper surface, a second conductive layer disposed on the lower surface and exposing a portion of the lower surface, wherein the inner circuit structure has a first dielectric layer disposed on the upper surface thereof and covering the first conductive layer, a second dielectric layer disposed on the lower surface thereof and covering the second conductive layer, a plurality of first conductive blind vias embedded in the first dielectric layer and connected to a portion of the first conductive layer, a plurality of second conductive blind vias embedded in the second dielectric layer and connected to a portion of the second conductive layer, and a fourth conductive layer disposed on the second dielectric layer, a first plating seed layer disposed between each of the first conductive blind vias and the first conductive layer, and a second plating seed layer disposed between each of the second conductive blind vias and the second conductive layer and on the second dielectric layer, a portion of the fourth conductive layer is electrically connected to the second conductive layer through the second conductive blind vias, and the fourth conductive layer and the second conductive blind vias are formed as an integrative unit;
    forming a third plating seed layer on the first dielectric layer and the plurality of the first conductive blind vias of the inner circuit structure thereby obtaining a semi-finished circuit substrate;
    cutting the semi-finished circuit substrate to form a plurality of circuit board units each having a circular shape, wherein each of the circuit board units comprise a plurality of circuit board sub-units each having a rectangular shape;
    fixing the plurality of the circuit board units respectively to a plurality of wafer carriers, so that the second dielectric layer of each of the circuit board units is in contact with the corresponding wafer carrier, wherein each of the circuit board units and the wafer carrier have substantially the same shape;
    forming a third conductive layer on the first dielectric layer of each of the circuit board units that are fixed on the wafer carriers, wherein the third conductive layer exposes a portion of the first dielectric layer, wherein a portion of the third conductive layer is electrically connected to the first conductive layer through the first conductive blind vias and the third plating seed layer therebelow, and the third plating seed layer is disposed between the third conductive layer and each of the first conductive blind vias; and
    removing the wafer carrier to expose a portion of the fourth conductive layer and a portion of the second dielectric layer.

2. The manufacturing method of the circuit substrate as claimed in claim 1, wherein the step of forming the first conductive blind vias comprises:
    forming a plurality of openings in the first dielectric layer;
    electroplating a metal layer on the first dielectric layer and filling the openings; and
    removing a portion of the metal layer on the first dielectric layer, such that a surface of the metal layer in each of the openings substantially aligns with a surface of the first dielectric layer to form the first conductive blind vias.

3. The manufacturing method of the circuit substrate as claimed in claim 1, wherein the step of forming the third conductive layer comprises:
    forming the third plating seed layer on the first dielectric layer and the first conductive blind vias;
    forming a patterned photoresist layer on the third plating seed layer;
    electroplating a metal layer on a portion of the third plating seed layer not covered by the patterned photoresist layer; and
    removing the patterned photoresist layer; and
    removing a portion of the third plating seed layer not covered by the metal layer.

4. The manufacturing method of the circuit substrate as claimed in claim 1, further comprising:
    after forming the third conductive layer, forming a first solder layer to cover a portion of the third conductive layer and a portion of the first dielectric layer exposed by the third conductive layer, wherein a portion of the third conductive layer not covered by the first solder layer constitutes a plurality of first pads; and
    after removing the wafer carrier, forming a second solder mask to cover a portion of the fourth conductive layer and a portion of the second dielectric layer exposed by the fourth conductive layer, wherein a portion of the fourth conductive layer not covered by the second solder mask constitutes a plurality of second pads.

5. The manufacturing method of the circuit substrate as claimed in claim 1, wherein the wafer carrier is fixed on the second dielectric layer through a release film, and the release film is removed by a lift off method when the wafer carrier is removed.

6. The manufacturing method of the circuit substrate as claimed in claim 1, wherein a shape of a cross-section of the third conductive layer gradually increases from the first dielectric layer in a direction away from the inner circuit structure.

7. The manufacturing method of the circuit substrate as claimed in claim 1, wherein a thickness of the third conductive layer is less than or equal to a thickness of the fourth conductive layer.

8. The manufacturing method of the circuit substrate as claimed in claim 1, wherein a thickness of the first dielectric layer is less than or equal to a thickness of the second dielectric layer.

9. The manufacturing method of the circuit substrate as claimed in claim 1, wherein the third plating seed layer comprises a copper layer, and a thickness of the copper layer ranges from 0.1 µm to 1 µm.

10. The manufacturing method of the circuit substrate as claimed in claim 1, wherein the third plating seed layer comprises a titanium copper composite layer, wherein the titanium copper composite layer has a titanium layer and a copper layer, and a thickness of the titanium layer ranges from 1000 Å to 5000 Å and a thickness of the copper layer ranges from 1000 Å to 10000 Å.

* * * * *